United States Patent
Lin et al.

(10) Patent No.: US 8,051,359 B2
(45) Date of Patent: Nov. 1, 2011

(54) SYSTEM AND METHOD FOR OPTIMIZING ITERATIVE CIRCUIT FOR CYCLIC REDUNDENCY CHECK (CRC) CALCULATION

(75) Inventors: Ming-I M. Lin, South Burlington, VT (US); David R. Stauffer, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 1290 days.

(21) Appl. No.: 11/676,653

(22) Filed: Feb. 20, 2007

(65) Prior Publication Data
US 2007/0162823 A1    Jul. 12, 2007

Related U.S. Application Data

(62) Division of application No. 10/249,290, filed on Mar. 28, 2003, now Pat. No. 7,191,383.

(51) Int. Cl.
*H03M 13/09* (2006.01)
(52) U.S. Cl. ........................... 714/757; 714/807
(58) Field of Classification Search .................. 714/757, 714/807
See application file for complete search history.

(56) References Cited

U.S. PATENT DOCUMENTS

| | | | | |
|---|---|---|---|---|
| 5,844,923 A * | 12/1998 | Condon | | 714/798 |
| 6,357,032 B1 * | 3/2002 | Plotz et al. | | 714/758 |
| 6,519,737 B1 * | 2/2003 | Derby | | 714/781 |
| 6,530,057 B1 * | 3/2003 | Kimmitt | | 714/758 |
| 6,560,742 B1 * | 5/2003 | Dubey et al. | | 714/757 |
| 6,701,478 B1 * | 3/2004 | Yang et al. | | 714/757 |
| 6,701,479 B2 * | 3/2004 | Keller | | 714/757 |
| 6,763,495 B2 * | 7/2004 | Suzuki et al. | | 714/781 |
| 6,820,228 B1 * | 11/2004 | Keller | | 714/757 |
| 6,934,902 B2 * | 8/2005 | Hara et al. | | 714/757 |

FOREIGN PATENT DOCUMENTS

| | | |
|---|---|---|
| JP | 2002-141809 | 5/2002 |
| WO | WO 02/082664 | 10/2002 |

* cited by examiner

*Primary Examiner* — Stephen Baker
(74) *Attorney, Agent, or Firm* — Scully, Scott, Murphy & Presser, P.C.; Michael J. LeStrange, Esq.

(57) ABSTRACT

A system for generating CRC code words associated with data ranging up to w-bytes in width to be communicated over a communications channel includes a first plurality of serially coupled code-generation blocks each for generating a CRC value based on data input to each block, respective blocks of the first plurality configured for receiving data inputs having respective byte widths ranging from $2^N+M$ to $2^{N-L}+M$, where N is equal to $\log_2(w)$, and M is an offset value, and L is a whole number based on a maximum propagation delay criteria; a second plurality of parallel coupled code-generation blocks each for generating a CRC value based on data inputs, respective blocks of the second plurality configured for receiving data having respective byte widths ranging from $2^{N-L}-1+M$ to $2^0$; and, a device for selecting particular CRC code generation blocks in the first and second pluralities to be included in a CRC calculation based on the data input; wherein any number of data input bytes may be processed.

15 Claims, 5 Drawing Sheets

SYSTEM AND METHOD FOR OPTIMIZING ITERATIVE CIRCUIT FOR CYCLIC REDUNDENCY CHECK (CRC) CALCULATION

RELATED APPLICATIONS

This application is a divisional of U.S. application Ser. No. 10/249,290, filed Mar. 28, 2003.

BACKGROUND OF THE INVENTION

1. Field of the Invention

The present invention relates generally to the implementation of packet-based cyclic redundancy checks in communications systems, and more particularly to an iterative circuit for performing and time optimizing a cyclic redundancy check calculation in a communications system.

2. Description of the Prior Art

Many packet-based communications protocols use code words appended to the packet transmission to check for the presence of errors introduced in the communications channel. One commonly used scheme for generating such code words is Cyclic Redundancy Check (CRC). The transmitter appends a CRC code word to the end of the packet, while the receiver recalculates the CRC for the entire packet, including the code word. Several CRC schemes are in common use; the various schemes use different polynomials for the calculation, and differ in the resulting code word length.

For a packet transmitted over a serial data stream, the logic circuitry required to calculate the CRC code word in the transmitter or the receiver is well-known and very efficient. A Linear Feedback Shift Register, with exclusive-OR gates as needed to implement the target polynomial, is a sufficient implementation. Each state of the shift register is calculated based on the current serial bit and the previous state of the shift register, So for a serial data stream, n latches (where n is the order of the polynomial) and a few exclusive-OR gates is the extent of the circuitry required.

However, high-speed serial data interfaces (e.g., 10 Gbps, 40 Gbps or above interfaces) often require more expensive technologies (such as SiGe (Silicon Germanium)) to implement data signals at serial baud rates. Such interfaces use high-speed analog circuits to implement the high-speed interfaces, and typically multiplex/demultiplex data to/from the serial interface into slower parallel data paths for processing within CMOS chips. Therefore, the CRC calculation circuit more typically operates on a parallel data bus. If the data bus is "w"-bytes wide, then the CRC calculation must simultaneously process w-bytes to determine the next state of the CRC calculation. Furthermore, since the next state of the CRC calculation is based on the previous state of the calculation, the calculation does not lend itself to pipelining.

A further complexity is introduced when the packet data is not guaranteed to be an integral number of w-bytes, and/or is not guaranteed to be start/stop in aligned locations on the parallel data bus. For example, given a 32-byte wide data bus, a CRC calculation circuit must therefore be capable of handling any of the possible resulting calculation widths: w=1, 2, 3, 4, . . . , 31, 32 bytes. This makes the next state decode for the CRC calculation significantly more complex. The resulting logic circuit may require a significant amount of chip area. Furthermore, since this chip area is primarily consumed by combinatorial logic with large fanout connections, wirability and timing issues may result.

In order to meet system requirements, the CRC calculation logic must typically consist of multiple CRC calculation blocks of various widths, with data steering to select data into each block to be used on any given cycle. One prior art implementation is to implement a w-byte wide data bus, and therefore use "w" CRC calculation blocks of sizes 1 byte, 2 bytes, 3 bytes, etc., up to w bytes, to implement the function. In this configuration, data is fed into all of these blocks in parallel. On any given clock cycle, only one of the CRC calculation block outputs is used. That is, in this parallel approach, one and only one CRC calculation block is selected during each cycle, so the combinatorial propagation delay will always be equivalent to the delay of one CRC calculation block.

It would be highly desirable to provide a structured, iterative approach to the CRC calculation circuitry whereby the CRC calculation may be subdivided into blocks with selectable bus widths which blocks can be cascaded to provide calculation for a bus width of any arbitrary number of bytes.

It would be highly desirable to provide a structured, iterative approach to the CRC calculation circuitry maximizes the circuit area reduction for a given target propagation delay.

SUMMARY OF THE INVENTION

The present invention is an approach for optimizing CRC calculations based on the realization that the size of CRC calculation blocks is directly proportional to the width of the calculation, and that by reducing the number of blocks for wide calculation widths provides greater savings than reducing the number of blocks for narrow calculation widths.

It is thus an object of the invention to provide a structured, iterative approach to the CRC calculation circuitry whereby the CRC calculation may be subdivided into blocks with selectable bus widths which blocks can be cascaded to provide calculation for a parallel bus width of any arbitrary number of bytes.

It is a further object of the invention to provide a structured, logarithmically iterative approach to the CRC calculation circuitry whereby the CRC calculation may be subdivided into blocks with selectable bus widths of the power of two (2) bytes, e.g., $2^N$, e.g., N=0, 1, . . . , X which blocks can be cascaded to provide calculation for a bus width of any arbitrary number of bytes.

It is a further object of the invention to provide a structured, logarithmically iterative approach to the CRC calculation circuitry whereby the CRC calculation may be subdivided into blocks which allow for selectable bus widths the values of which are not powers of 2.

The structured approach to the CRC calculation is carried out by iterative circuitry whereby according to a preferred embodiment, there is provided a system for generating CRC code words associated with data ranging up to w-bytes in width to be communicated over a communications channel including:

a first plurality of serially coupled code-generation blocks each for generating a CRC value based on data input to each block, respective blocks of the first plurality configured for receiving data inputs having respective byte widths ranging from $2^N+M$ to $2^{N-L}+M$, where $2^N+M=w$, and M is an offset value, and L is a whole number based on a maximum propagation delay criteria;

a second plurality of parallel coupled code-generation blocks each for generating a CRC value based on data inputs, respective blocks of the second plurality configured for receiving data having respective byte widths ranging from $2^{N-L}-1+M$ to $2^0$; and, a means for selecting particular CRC code generation blocks in the first and second pluralities to be included in a CRC calculation based on the data input; so that data input bytes of arbitrary width may be processed.

According to the principles of the invention, the CRC calculation process times in the structured, iterative approach, is optimized based on the realization that the size of CRC calculation blocks is directly proportional to the width of the calculation, and that by reducing the number of blocks for wide calculation widths provides greater savings than reducing the number of blocks for narrow calculation widths. Advantageously, for wide data bus widths, a structured, logarithmically iterative approach significantly reduces the amount of logic required to perform the calculation.

BRIEF DESCRIPTION OF THE FIGURES

The objects, features and advantages of the present invention will become apparent to one skilled in the art, in view of the following detailed description taken in combination with the attached drawings, in which.

DETAILED DESCRIPTION OF THE PREFERRED EMBODIMENTS

Figure 1:
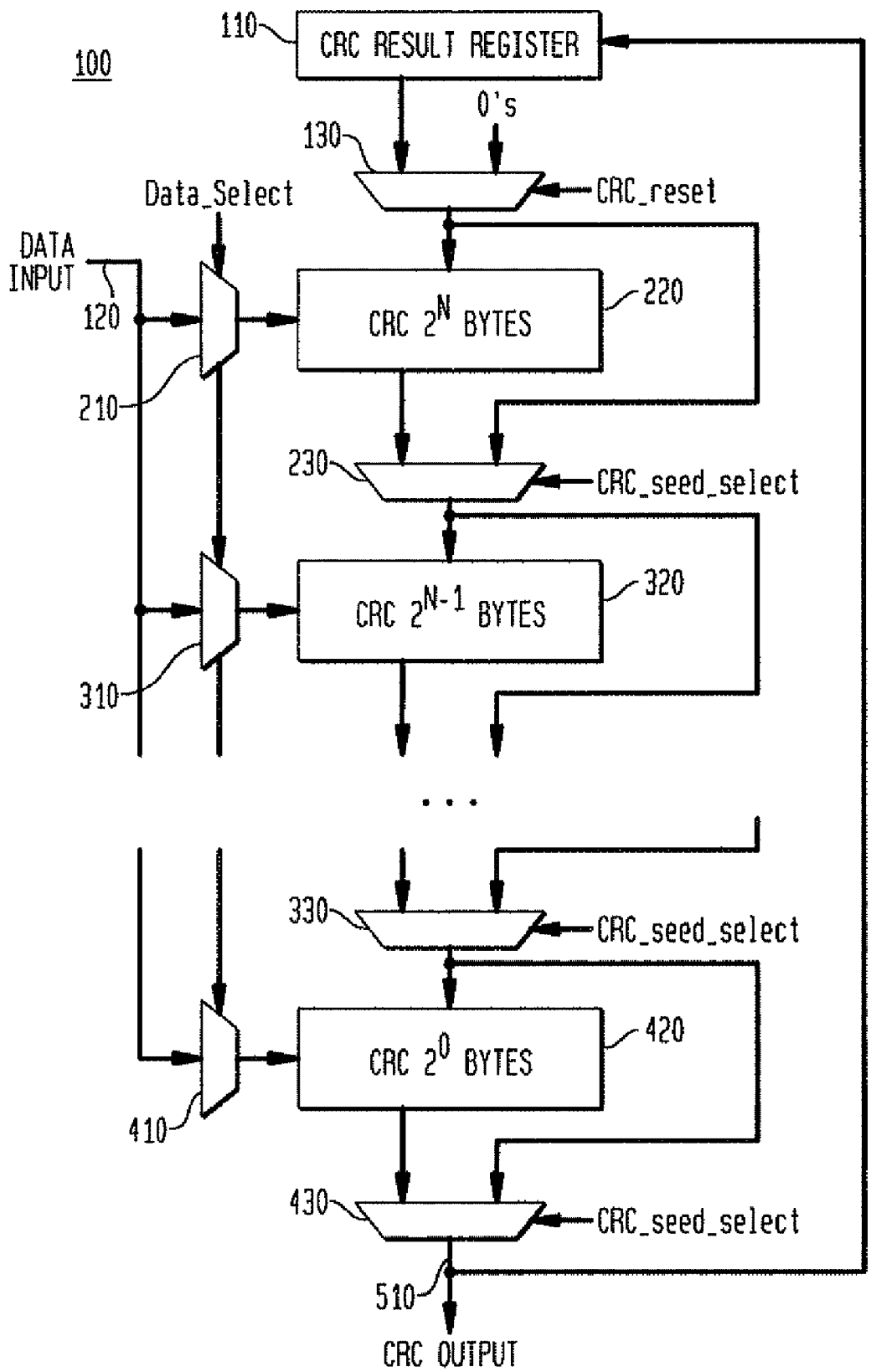
FIG. 1 is a block diagram of an overall system architecture in which the present invention can operate, formed in accordance with one embodiment of the present invention.

The present invention may be more fully understood with reference to FIG. 1, which shows an overall system architecture according to a first embodiment of the invention.

The first embodiment is directed to a structured logarithmically iterative approach to the CRC calculation circuitry that provides for the cascading of CRC calculation blocks, with the number of blocks being cascaded dependent on the desired width of the calculation.

FIG. 1 is a block diagram of the CRC calculation circuitry 100 according to a first variant of the present invention. According to this first variant, the CRC calculation circuitry 100 is subdivided into blocks which have logarithmically selected bus widths of 1 byte, 2 bytes, 4 bytes, 8 bytes, etc (i.e. powers of two bytes). These blocks can be cascaded to provide calculation for a bus width of any arbitrary number of bytes.

As shown in FIG. 1, the logic circuit 100 includes several CRC calculation blocks (220, 320, 420), each of which calculates the CRC value based on a seed input from the seed multiplexors (130, 230, 330, 430), and based on the data input (120). It is understood that the incoming data input path width of w-byte should equal $2^N$. That is, for a w-byte data bus, $N=\log_2(w)$, and the circuit includes N+1 CRC calculation blocks for byte widths corresponding to $2^N, 2^{N-1}, \ldots 2^1, 2^0$.

When performing a calculation, the CRC_seed_select signals control the seed multiplexors (230, 330, 430) to select whether a respective CRC calculation block is included in the calculation, or is bypassed. By selectively including or bypassing these blocks, an arbitrary number of bytes may be processed. For instance, to process w bytes, the $2^N$ block is selected and all other blocks are bypassed; to process w−1 bytes, the $2^N$ block is bypassed, and blocks $2^{N-1}, \ldots, 2^0$ are selected; to process w−2 bytes, the $2^N$ and $2^0$ blocks are bypassed, and blocks $2^{N-1}, \ldots, 2^1$ are selected; and so forth. It is understood that each CRC calculation block is a combinatorial XOR tree, the exact design of which is dependent on the CRC polynomial being implemented.

The circuit initially starts with CRC_reset signal asserted such that the initial seed value of 0's is selected by multiplexor 130. The selected CRC calculation is then performed by CRC calculation blocks (220, 320, 420) as selected or bypassed by seed multiplexors (230, 330, 430). The output of the CRC calculation at multiplexor 430 is stored in the CRC result register 110. The CRC register value is updated in each cycle based on the Data Input (120). Data steering multiplexors (210, 310, 410) select the data to be used at each CRC calculation block based on which blocks are selected. On the last cycle of the packet, the CRC output 510 provides the calculated CRC value for the packet to downstream logic.

In an example embodiment of the invention, there is provided a 32-byte wide data input. This N=5 system therefore has 6 CRC calculation blocks of widths 32 bytes, 16 bytes, 8 bytes, 4 bytes, 2 bytes, and 1 byte. Nominally, packet data consumes the entire bus width, and the 32 byte wide CRC calculation block is selected. However, the packet may only consume a portion of the bus width at the beginning and the end of the packet transmission. In these cases, CRC_select and Data_select control signals are generated based on the expected data alignment on the bus.

For wide data bus widths, the approach according to the first variant significantly reduces the amount of logic required to perform the calculation. (For w=32 bytes, an 88% logic size reduction can be realized). For a w-byte wide data bus, with the number of blocks being cascaded dependent on the desired width of the calculation, the worst case propagation delay occurs for a calculation width of w−1, during which $\log_2(w)$ CRC calculation blocks are cascaded.

According to this embodiment, the CRC for an incoming data packet which is longer than w bytes will be calculated over several clock cycles. Let R represent the number of bytes which must be processed in a given clock cycle of the calculation. Although R may take arbitrary values (R≦w) on any clock cycle, the CRC calculation requires some number of cycles during which R=w, plus one cycle when any remaining bytes are to be processed.

Thus, a control stage for the first embodiment which can process R bytes of data (R≦w) and wherein the calculation circuitry is comprised of CRC calculation blocks of size $2^N$, $2^{(N-1)}, 2^{(N-2)}, \ldots, 4(=2^2), 2(=2^1)$ and $1(=2^0)$ bytes. If w=32, then there are 32_byte, 16_byte, 8_byte, 4_byte, 2_byte, 1_byte blocks. The control logic asserts control signals $A_{n-1}$, $A_{n-2}, \ldots, A_0$ such that R≦32; $R=(A_{n-1})*2^{(N-1)}+(A_{n-2})*2^{(N-2)}+\ldots+(A_0)*1$. The control signals $A_{n-1}, A_{n-2} \ldots, A_0=1$ or 0 to select blocks as specified below.

| | | |
|---|---|---|
| When R = 32 | then 32_byte or 16_byte + 16_byte | CRC are used |
| When R = 31 | then 16_byte + 8_byte + 4_byte + 2_byte + 1_byte | CRC are used |
| When R = 30 | then 16_byte + 8_byte + 4_byte + 2_byte | CRC are used |

-continued

| | | |
|---|---|---|
| When R = 29 | then 16_byte + 8_byte + 4_byte + 1_byte | CRC are used |
| When R = 28 | then 16_byte + 8_byte + 4_byte | CRC are used |
| When R = 27 | then 16_byte + 8_byte + 2_byte + 1_byte | CRC are used |
| When R = 26 | then 16_byte + 8_byte + 2_byte | CRC are used |
| When R = 25 | then 16_byte + 8_byte + 1_byte | CRC are used |
| When R = 24 | then 16_byte + 8_byte | CRC are used |
| When R = 23 | then 16_byte + 4_byte + 2_byte + 1_byte | CRC are used |
| When R = 22 | then 16_byte + 4_byte + 2_byte | CRC are used |
| When R = 21 | then 16_byte + 4_byte + 1_byte | CRC are used |
| When R = 20 | then 16_byte + 4_byte | CRC are used |
| When R = 19 | then 16_byte + 2_byte + 1_byte | CRC are used |
| When R = 18 | then 16_byte + 2_byte | CRC are used |
| When R = 17 | then 16_byte + 1_byte | CRC are used |
| When R = 16 | then 16_byte | CRC is used |
| When R = 15 | then 8_byte + 4_byte + 2_byte + 1_byte | CRC are used |
| When R = 14 | then 8_byte + 4_byte + 2_byte | CRC are used |
| When R = 13 | then 8_byte + 4_byte + 1_byte | CRC are used |
| When R = 12 | then 8_byte + 4_byte | CRC are used |
| When R = 11 | then 8_byte + 2_byte + 1_byte | CRC are used |
| When R = 10 | then 8_byte + 2_byte | CRC are used |
| When R = 9 | then 8_byte + 1_byte | CRC are used |
| When R = 8 | then 8_byte | CRC is used |
| When R = 7 | then 4_byte + 2_byte + 1_byte | CRC are used |
| When R = 6 | then 4_byte + 2_byte | CRC are used |
| When R = 5 | then 4_byte + 1_byte | CRC are used |
| When R = 4 | then 4_byte | CRC is used |
| When R = 3 | then 2_byte + 1_byte | CRC are used |
| When R = 2 | then 2_byte | CRC is used |
| When R = 1 | then 1_byte | CRC is used |

For each CRC module, 32_byte, . . . , 1_byte, data of corresponding byte length will be sent to it. For example: when R=10, then 8_byte+2_byte modules are used, and the control signal 'Data_select' (shown in FIG. 1) is asserted to choose first 8 bytes of data to 8_byte CRC calculation block and last 2 byte of data will send to the 2_byte CRC calculation block.

The second variant of the invention provides an optimization between the prior art approach and the first variant, i.e., logarithmically iterative approach. According to this embodiment, area reduction is maximized for a given target propagation delay. This is accomplished by noting that the size of CRC calculation blocks is directly proportional to the width of the calculation. Therefore, reducing the number of CRC calculation blocks for wide calculation widths provides greater savings that reducing the number of blocks for narrow calculation widths. At the same time, propagation delays in the cascaded blocks of the logarithmically iterative approach are primarily through CRC calculation blocks of narrow width. Thus, by using the logarithmically iterative approach for wider calculation widths, and using the parallel approach for smaller calculation widths, an optimization of timing versus area for the circuit is provided.

Assume a system for which w=byte width of the data bus. Given $N=\log_2(w)$ and $d_{max}$=maximum delay (in units of CRC calculation block delays) that is to be permitted, then $L=d_{max}-1$.

A CRC calculation system according to the second variant is then constructed using a logarithmically iterative approach for CRC calculation block widths of $2^{N-L}$ and greater, and using a parallel approach for CRC calculation block widths of less than $2^{N-L}$. The resulting system contains CRC calculation blocks for byte widths of $2^N$, $2^{N-1}$, . . . , $2^{N-L+1}$, $2^{N-L}$, $2^{N-L}-1$, $2^{N-L}-2$, . . . , $2^1$, $2^0$. The resulting system contains L+1 CRC calculation blocks in the logarithmically iterative portion of the system, and $2^{N-L}-1$ CRC calculation blocks in the parallel portion of the circuit. The worst case delay through such a system occurs for calculation byte widths in the range of $2^N-1$ to $2^{N-1}+1$ inclusive. In this range there are L cascaded iterative CRC calculation blocks plus one parallel CRC calculation block through which propagation must occur.

The second variant of the disclosed invention assumes the target byte width (w) of the CRC calculation is a power of 2.

Figure 2:
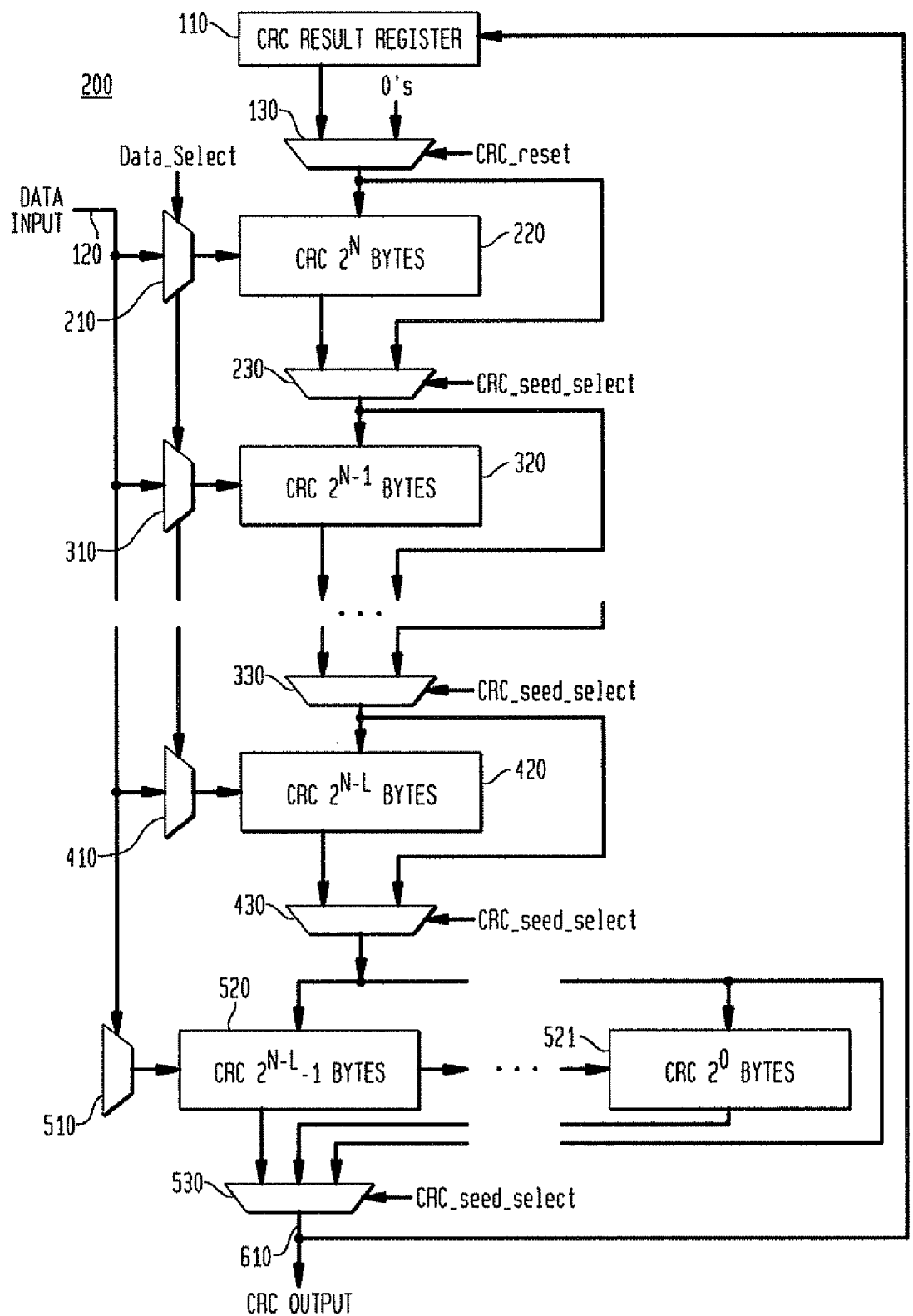
FIG. 2 is a block diagram of an overall system architecture in which the present invention can operate, formed in accordance with a second embodiment of the present invention.

FIG. 2 is a block diagram of the CRC calculation circuitry 200 according to the second variant of the disclosed invention. As shown in FIG. 2, the logic circuit 200 includes several CRC calculation blocks (220, 320, 420, 520, 521), each which calculates the CRC value based on the seed input from the seed multiplexors (130, 230, 330, 430), and based on the data input (120). For a system with a w-byte data bus and a maximum delay $d_{max}$, $N=\log_2(w)$, and $L=d_{max}-1$. The logarithmically iterative portion of the system includes L+1 CRC calculation blocks for byte widths corresponding to $2^N$, $2^{N-1}$, . . . $2^{N-L}$ (220, 320, 420). The parallel portion of the system includes $2^{N-L}$ CRC calculation blocks for byte widths corresponding to $2^{N-L}-1$, . . . $2^0$ (520, 521). When performing a calculation, the CRC_seed_select signals control the seed multiplexors (730, 330, 430) so as to select whether each iterative CRC calculation block is included in the calculation, or is bypassed. By selectively including or bypassing these blocks, any number of bytes divisible by $2^{N-L}$ may be processsed. In addition, multiplexor 530 selects which of parallel CRC calculation blocks (520, 521), if any, is selected to provide the output. This extends the processing capability to any arbitrary number of bytes.

For instance, to process w bytes, the $2^N$ block is selected, all other iterative blocks are bypassed, and multiplexor 530 selects the bypass input; to process w−1 bytes, the $2^N$ block is bypassed, all other iterative blocks (i.e., block $2^{N-1}$, . . . , $2^{N-L+1}$, $2^{N-L}$) are selected, and multiplexor 530 selects the input from the $2^{N-L}-1$ block; and so forth. Each CRC calculation block is a combinatorial XOR tree, the exact design of which is dependent on the CRC polynomial being implemented.

The circuit intially starts with CRC_reset asserted such that the initial seed value of 0's is selected by multiplexor 130. The selected CRC calculation is then performed by iterative CRC calculation blocks (220, 320, 420) as selected or bypassed by seed multiplexors (230, 330, 430), and by parallel CRC calculation blocks (520, 521) as selected or bypassed by output multiplexor 530. The output of the CRC calculation at multiplexor 530 is stored in the CRC result register 110. The CRC register value is updated in each cycle based on the Data Input (120). Data steering multiplexors (210, 310, 410) select the data to be used at each iterative CRC calculation block based on which blocks are selected. Data steering multiplexor 510 selects the data to be used by the selected parallel CRC calculation block. On the last cycle of the packet, the CRC output 610 provides the calculated CRC value for the packet to downstream logic.

In an example embodiment implementing the second variant of the invention, for a 32-byte wide data bus input, dmax=3. This results in an N=5, L=2 system having three (3) iterative CRC calculation blocks of widths 32 bytes, 16 bytes, and 8 bytes; and 7 parallel CRC calculation blocks of widths 7 bytes down to 1 byte. Nominally, packet data consumes the entire bus width, and the 32 byte wide CRC calculation block is selected. However, the packet may only consume a portion of the bus width at the beginning and the end of the packet transmission. In these cases, CRC_select and Data_select control signals are generated based on the expected data alignment on the bus.

In the timing optimized version according to the second variant of FIG. 2, there are less stages in the critical path than that of FIG. 1 in order to achieve better timing. As with the previous embodiment, a CRC calculation for a data packet of length greater than w bytes is performed over multiple clock cycles. Let R represent the number of bytes which must be processed in a given clock cycle of the calculation.

Thus, a control stage for the second embodiment may process R bytes of data (R≦w) and wherein the calculation circuitry is comprised of CRC calculation blocks of size $2^N, 2^{(N-1)}, 2^{(N-2)}, \ldots, 2^{(N-L)}, -2^{(N-L)}-1, -2^{(N-L)}-2 \ldots$ and 1 bytes. If w=32, N=5, and L=2, then there are 32_byte, 16_byte, 8_byte, 7_byte, 6_byte, 5_byte, 4_byte, 3_byte, 2_byte and 1_byte CRC stages. The control logic asserts control signals $A_{n-1}, A_{n-2}, \ldots A_{n-L}, B_{K-1}, \ldots B_0$ to select processing for R bytes such that R≦32, and $R = (A_{n-1})*2^{(N-1)} + (A_{n-2})*2^{(N-2)} + \ldots + (A_0)*2^{(N-L)} + (B_{K-1})*(2^{(N-L)}-1) + \ldots + (B_0)*1$, where $K = 2^{N-L}$. The control signals $A_{n-1}, A_{n-2}, \ldots A_{n-L}, B_{K-1}, \ldots B_0 = 1$ or 0 to select blocks as specified below.

| | | |
|---|---|---|
| When R = 32 | then 32_byte or 16_byte + 16_byte | CRC are used |
| When R = 31 | then 16_byte + 8_byte + 7_byte | CRC are used |
| When R = 30 | then 16_byte + 8_byte + 6_byte | CRC are used |
| When R = 29 | then 16_byte + 8_byte + 5_byte | CRC are used |
| When R = 28 | then 16_byte + 8_byte + 4_byte | CRC are used |
| When R = 27 | then 16_byte + 8_byte + 3_byte | CRC are used |
| When R = 26 | then 16_byte + 8_byte + 2_byte | CRC are used |
| When R = 25 | then 16_byte + 8_byte + 1_byte | CRC are used |
| When R = 24 | then 16_byte + 8_byte | CRC are used |
| When R = 23 | then 16_byte + 7_byte | CRC are used |
| When R = 22 | then 16_byte + 6_byte | CRC are used |
| When R = 21 | then 16_byte + 5_byte | CRC are used |
| When R = 20 | then 16_byte + 4_byte | CRC are used |
| When R = 19 | then 16_byte + 3_byte | CRC are used |
| When R = 18 | then 16_byte + 2_byte | CRC are used |
| When R = 17 | then 16_byte + 1_byte | CRC are used |
| When R = 16 | then 16_byte | CRC is used |
| When R = 15 | then 8_byte + 7_byte | CRC are used |
| When R = 14 | then 8_byte + 6_byte | CRC are used |
| When R = 13 | then 8_byte + 5_byte | CRC are used |
| When R = 12 | then 8_byte + 4_byte | CRC are used |
| When R = 11 | then 8_byte + 3_byte | CRC are used |
| When R = 10 | then 8_byte + 2_byte | CRC are used |
| When R = 9 | then 8_byte + 1_byte | CRC are used |
| When R = 8 | then 8_byte | CRC is used |
| When R = 7 | then 7_byte | CRC is used |
| When R = 6 | then 6_byte | CRC is used |
| When R = 5 | then 5_byte | CRC is used |
| When R = 4 | then 4_byte | CRC is used |
| When R = 3 | then 3_byte | CRC is used |
| When R = 2 | then 2_byte | CRC is used |
| When R = 1 | then 1_byte | CRC is used |

The third embodiment of the circuit for performing and time optimizing a cyclic redundancy check calculation is directed to a structured logarithmically iterative approach that is more generic, allowing for values of "w" which are not powers of 2.

Figure 3:
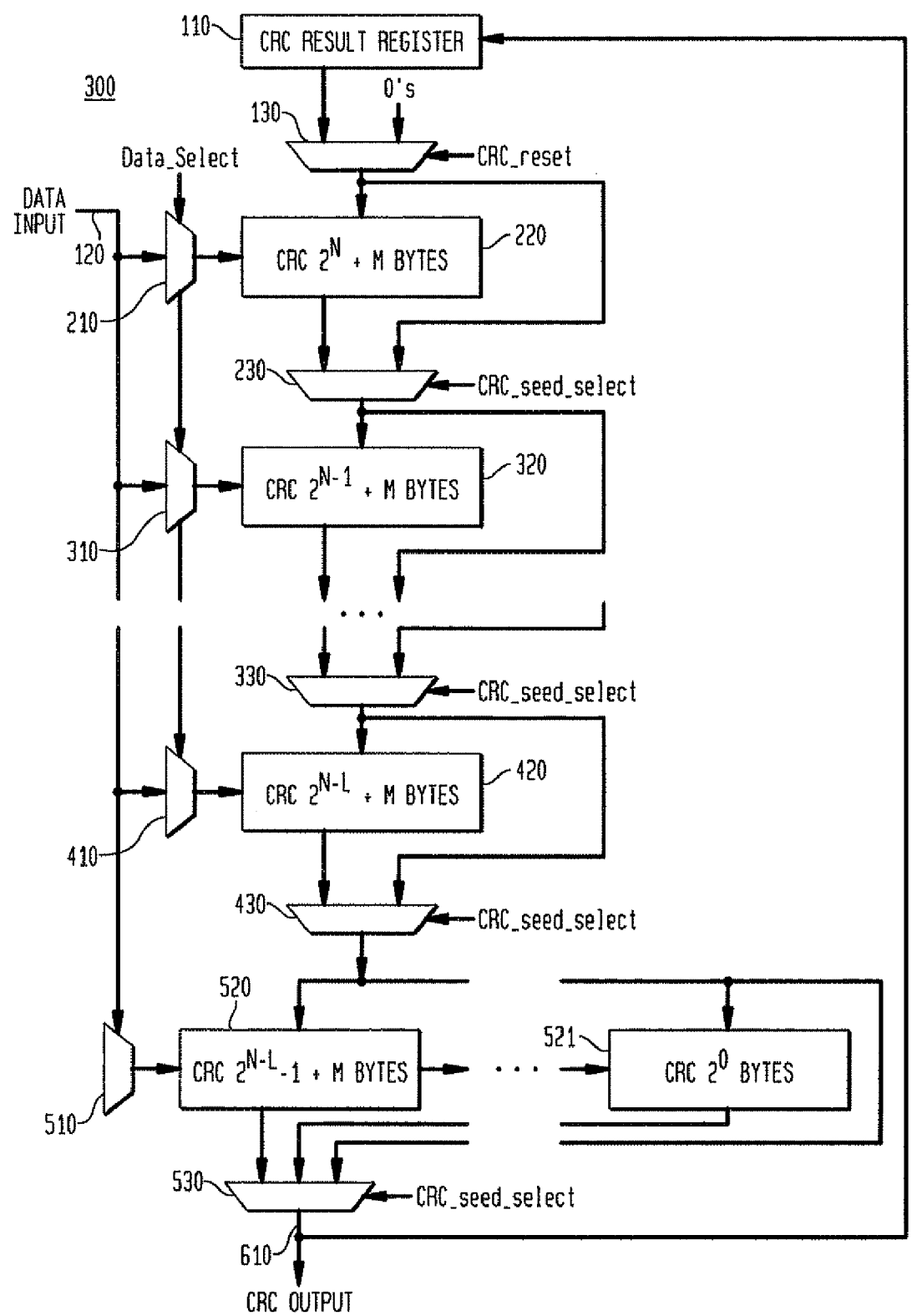
FIG. 3 is a block diagram of an overall system architecture in which the present invention can operate, formed in accordance with a third embodiment of the present invention.

FIG. 3 is a block diagram of the CRC calculation circuitry 300 according to a third variant of the present invention. According to this third variant, the logarithmically iterative portion of the system includes L+1 CRC calculation blocks for which the byte widths have been more generically assigned as $2^N+M, 2^{N-1}+M, \ldots 2^{N-L}+M$ (220, 320, 420), where M is a positive offset value (i.e., greater than or equal to zero) comprising an arbitrary constant. This more generic representation according to the third variant permits target byte widths (w) for the system to be values other than powers of 2. Correspondingly, the parallel portion of the system includes $2^{N-L}+M$ CRC calculation blocks for byte widths corresponding to $2^{N-L}-1+M, \ldots, 2^0$ (520, 521). As with previously described variants of this invention, when performing a calculation, the CRC_seed_select signals control the seed multiplexors (230, 330, 430) so as to select whether each iterative CRC calculation block is included in the calculation, or is bypassed. By selectively including or bypassing these blocks, any number of bytes divisible by $2^{N-L}$ may be processed. In addition, multiplexor 530 selects which of parallel CRC calculation blocks (520, 521), if any, is selected to provide the output.

Figure 4:
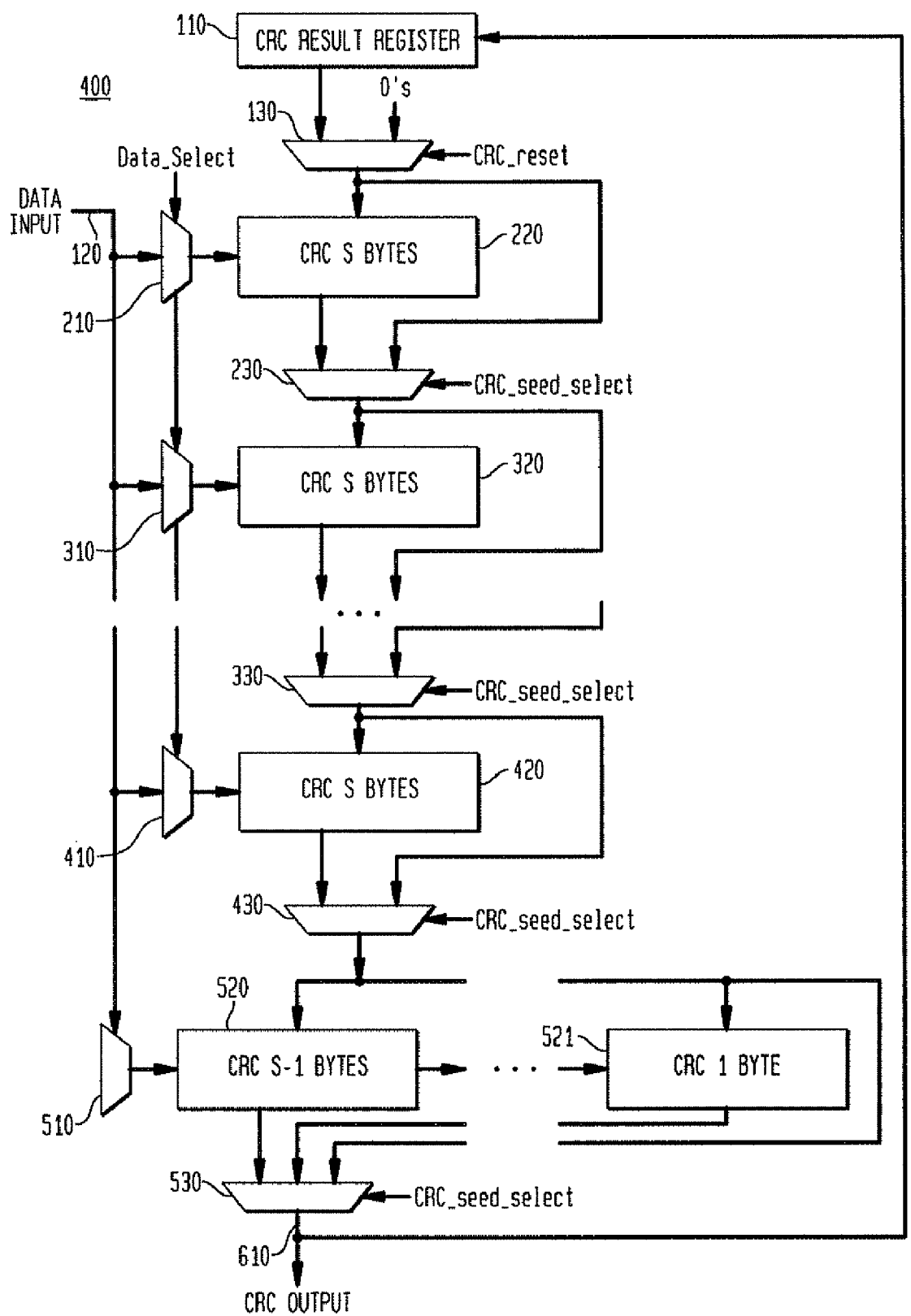
FIG. 4 is a block diagram of an overall system architecture in which the present invention can operate, formed in accordance with a fourth embodiment of the present invention.

FIG. 4 is a block diagram of the CRC calculation circuitry 400 according to a fourth embodiment of the invention wherein each CRC calculation block (220, 320, 420, etc.) is able to process S bytes, where S is an arbitrary positive integer. The iterative portion of the circuit includes "k" blocks, each capable of processing S bytes, such that (k+1)*S>w and k*S≦w. The parallel portion of the system includes B−1 calculation blocks for byte widths corresponding to S−1, S−2, . . . 1. When performing a calculation, the CRC_seed_select signals control the seed multiplexors (130, 230, 330, 430) to select a multiple of S-bytes to be processed. In addition, multiplexor 530 selects which of parallel CRC calculation blocks (520, 521), if any, is selected to provide the output. This extends the processing capability to any arbitrary number of bytes.

The fourth embodiment reduces logic over that of implementations using the second or third embodiments, while still optimizing timing over that of implementations using the first embodiment. Let d represent the delay (in units of CRC calculation blocks) for the circuit. Then worst case value of d through this circuit occurs for calculations of x-bytes in the range k*S to w bytes, when k blocks are selected to perform the calculation on the first k*S bytes, and one parallel block is selected to perform the calculation on remaining bytes, such that d=k+1. For the case of w=33 bytes, L=2, M=1, k=4, an implementation using the third embodiment would have a worst case delay d=2 blocks, while this embodiment has a worst case delay d=5 blocks. However this embodiment reduces logic since the number of larger width CRC calculation blocks are reduced over that of the second embodiment.

In accordance with this embodiment, it is typically the case that the number of parallel configured CRC calculation blocks be equal to S−1, however, for a more aggressive timing scheme, the number of parallel configured CRC calculation blocks may exceed S.

Thus, a control stage for the fourth embodiment can process R bytes of data (R≦w) and wherein the calculation circuitry is comprised of k blocks of S bytes and S−1 parallel blocks of S−1, S−2, . . . 1 bytes. For example, in accordance with the fourth variant of the invention depicted in FIG. 4 where w=34, and S=5, the control logic asserts control signals $A_{k-1}, A_{k-2}, \ldots A_0, B_{S-1}, \ldots B_0$ to select processing for R bytes such that R≦34, and $R=(A_{k-1})*S+(A_{k-2})*S+ \ldots +(A_0)*S+(B_{S-1})*(S-1)+ \ldots +(B_0)*1$. The control signals $A_{k-1}, A_{k-2}, \ldots A_0, B_{S-1}, \ldots B_0 = 1$ or 0 as specified below (where X represents the number of blocks of S bytes selected during a given clock cycle, the selection of which is otherwise arbitrary):

```
34 Bytes CRC = S_byte*6 + 4_byte where X = 6 (whole path)
33 Bytes CRC = S_byte*6 + 3_byte where X = 6
32 Bytes CRC = S_byte*6 + 2_byte where X = 6
31 Bytes CRC = S_byte*6 + 1_byte where X = 6
30 Bytes CRC = S_byte*6 where X = 6
29 Bytes CRC = S_byte*5 + 4_byte where X = 5
25 Bytes CRC = S_byte*5 where X = 5
24 Bytes CRC = S_byte*4 + 4_byte where X = 4
23 Bytes CRC = S_byte*4 + 3_byte where X = 4
22 Bytes CRC = S_byte*4 + 2_byte where X = 4
21 Bytes CRC = S_byte*4 + 1_byte where X = 4
20 Bytes CRC = S_byte*4 where X = 4
19 Bytes CRC = S_byte*3 + 4_byte where X = 3
18 Bytes CRC = S_byte*3 + 3_byte where X = 3
17 Bytes CRC = S_byte*3 + 2_byte where X = 3
16 Bytes CRC = S_byte*3 + 1_byte where X = 3
15 Bytes CRC = S_byte*3 where X = 3
14 Bytes CRC = S_byte*2 + 4_byte where X = 2
13 Bytes CRC = S_byte*2 + 3_byte where X = 2
12 Bytes CRC = S_byte*2 + 2_byte where X = 2
11 Bytes CRC = S -byte*2 + 1_byte where X = 2
10 Bytes CRC = S -byte*2 where X = 2
 9 Bytes CRC = S_byte + 4_byte where X = 1
 8 Bytes CRC = S_byte + 3_byte where X = 1
 7 Bytes CRC = S_byte + 2_byte where X = 1
 6 Bytes CRC = S_byte + 1_byte where X = 1
 5 Bytes CRC = S_byte where X = 1
 4 Bytes CRC = 4_byte where X = 0
 3 Bytes CRC = 3_byte where X = 0
 2 Bytes CRC = 2_byte where X = 0
 1 Bytes CRC = 1_byte where X = 0
```

Figure 5:
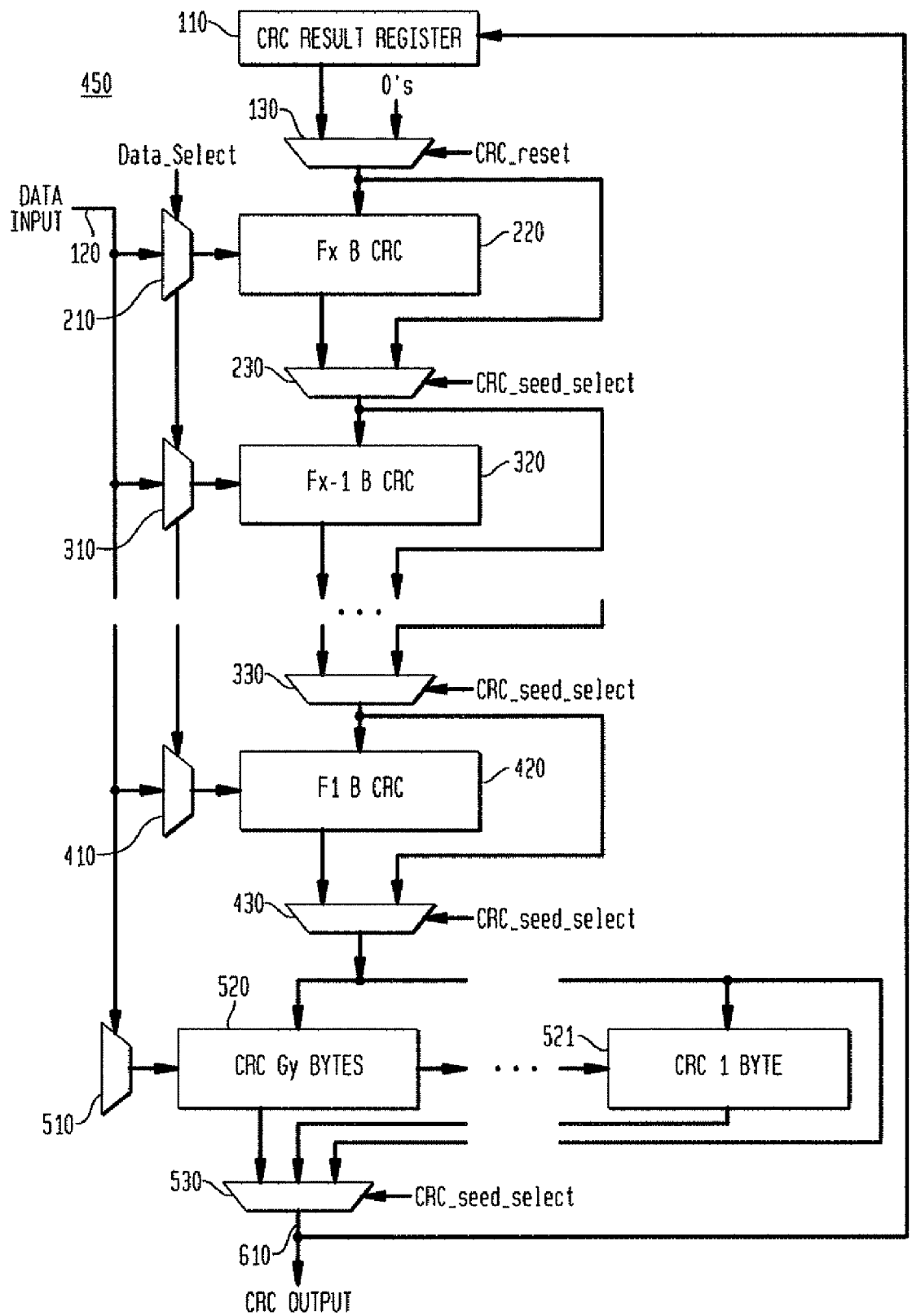
FIG. 5 is a block diagram of an overall system architecture in which the present invention can operate, formed in accordance with a generic embodiment of the present invention.

FIG. 5 provides a generic form of the CRC calculation circuitry 450 encompassing all four variants of the invention described with respect to FIGS. 1-4, with CRC calculation block byte widths ranging in size from $F_x, F_{x-1}, \ldots F_1$, where $F_x \geq F_{x-1} \geq \ldots \geq F_1 \geq 0$ bytes for the iterative portion of serially cascaded blocks (220, 320, 420, etc.); and, CRC calculation block byte widths of sizes $G_{y-i}$ bytes for the parallel blocks (520, 521, etc.) where $G_{y-i} = G_{y-i-1}+1$ for i=0 to y−1 where $y \geq F_1 - 1$. According to the generic form, the number of bytes included in the CRC calculation can be expressed according to the following relation: $R = A_x*F_x + A_{x-1}*F_{x-1} + \ldots +A_1*F_1 + B_y*G_y + \ldots + B_1*G_1$, where x is the number of $F_x$ blocks and y is the number of $G_y$ blocks and $A_x, A_{x-1}, \ldots A_1, B_y, \ldots B_1 = 0$ or 1 as described in accordance with one of the four embodiments.

FIG. 5 depicts the generic form of all variants of the invention. For the first embodiment: $F_x=2^N, F_{x-1}=2^{N-1}, \ldots F_1=2^0$; and $y=F_1-1=0$ such that there are no CRC calculation blocks in the parallel portion of the circuit. For the second embodiment: $F_x=2^N, F_{x-1}=2^{N-1}, \ldots F_1=2^{N-L}, G_y=2^{N-L}1, \ldots G_1=1$.

For the third embodiment: $F_x=2^N+M, F_{x-1}=2^{N-1}+M \ldots F_1=2^{N-L}+M, G_y=2^{N-L}+M-1, \ldots G_1=1$. For the fourth embodiment: $Fx=Fx-1= \ldots =F1=S$; and $G_y=y-1, \ldots, G_1=1$ where $y \geq S-1$.

While the invention has been particularly shown and described with respect to illustrative and preferred embodiments thereof, it will be understood by those skilled in the art that the foregoing and other changes in form and details may be made therein without departing from the spirit and scope of the invention that should be limited only by the scope of the appended claims.

The invention claimed is:

1. A circuit for generating CRC code words associated with bytes of data to be transmitted over a communications channel, said communications channel capable of transmitting data up to w-bytes in width, said circuit comprising:
   a first plurality of serially coupled code-generation blocks each for generating a CRC value based on data input to said block, respective blocks of said first plurality of code-generation blocks configured for receiving data inputs having respective byte widths ranging from $2^N+M, 2^{N-1}+M, \ldots, 2^{N-L}+M$ where $w=2^N+M$, M is an offset value, and L is a whole number based on a maximum propagation delay criteria for processing CRC values in said first plurality;
   a second plurality of parallel coupled code-generation blocks each for generating a CRC value based on data input to said block, respective blocks of said second plurality of code-generation blocks configured for receiving data inputs having respective byte widths ranging from $2^{N-L}-1+M, 2^{N-L}-2+M, \ldots, 2^0$;
   a multiplexor means controllable for selecting particular CRC code generation blocks in said first and second pluralities to be included in a CRC calculation based on said data input;
   wherein by selectively including or bypassing CRC code generation blocks any number of data input bytes divisible by $2^{N-L}$ may be processed for corresponding CRC code generation.

2. The CRC code generating circuit as claimed in claim 1, wherein M≧0.

3. The CRC code generating circuit as claimed in claim 1, wherein N is equal to $\log_2(w)$.

4. A circuit for generating CRC code words associated with bytes of data to be transmitted over a communications channel, said communications channel capable of transmitting data up to w-bytes in width, said circuit comprising:
   a first plurality of serially coupled code-generation blocks each for generating a CRC value based on data input to said block, respective blocks of said first plurality of code-generation blocks configured for receiving data inputs having respective byte widths of two's power ranging from $2^N$ to $2^{N-L}$, where N is equal to $\log_2(w)$ and L is a whole number based on a maximum propagation delay criteria for processing CRC values in said first plurality;
   a second plurality of parallel coupled code-generation blocks each for generating a CRC value based on data input to said block, respective blocks of said second plurality of code-generation blocks configured for receiving data inputs having respective byte widths ranging from $2^{N-L}-1$ to $2^0$;
   a multiplexor means controllable for selecting particular CRC code generation blocks in said first and second pluralities to be included in a CRC calculation based on said data input;

wherein by selectively including or bypassing CRC code generation blocks any number of data input bytes divisible by $2^{N-L}$ may be processed for corresponding CRC code generation.

5. The CRC code generating circuit as claimed in claim 4, wherein said first plurality of serially coupled code-generation blocks comprises a quantity L+1, and said second plurality of parallel coupled code-generation blocks comprises a quantity $2^{N-L}-1$.

6. The CRC code generating circuit as claimed in claim 4, wherein said first maximum propagation delay criteria for processing CRC values in said first plurality of serially coupled code-generation blocks comprises a maximum delay, $d_{max}$, of clock cycles, wherein said whole number $L=d_{max}-1$.

7. A circuit for generating CRC code words associated with bytes of data to be transmitted over a communications channel, said communications channel capable of transmitting data up to w-bytes in width, said circuit comprising:
- a first plurality of serially coupled code-generation blocks each for generating a CRC value based on data input to said block, each block of said first plurality of code-generation blocks configured for receiving data inputs having a byte width of S bytes;
- a second plurality of parallel coupled code-generation blocks each for generating a CRC value based on data input to said block, respective blocks of said second plurality of code-generation blocks configured for receiving data inputs having respective byte widths ranging from y bytes to 1 byte;
- a multiplexor means controllable for selecting particular CRC code generation blocks in said first and second pluralities to be included in a CRC calculation based on said data input;
- wherein a time for calculating a particular CRC code value in said first plurality of serially coupled code-generation blocks summed with time for processing a particular CRC code value in said second plurality of parallel coupled code-generation blocks is less than or equal to a single clock period.

8. The CRC code generating circuit as claimed in claim 7, wherein y=S-1, said byte widths of said second plurality ranging consecutively from S-1, S-2, . . . 1 bytes.

9. The CRC code generating circuit as claimed in claim 7, wherein y>S.

10. The CRC code generating circuit as claimed in claim 7, wherein said first plurality of serially coupled code-generation blocks includes k blocks, each block capable of processing S bytes, such that (k+1)*S>w and k*S≤w.

11. A circuit for generating CRC code words associated with bytes of data to be transmitted over a communications channel, said communications channel capable of transmitting data up to w-bytes in width, said circuit comprising:
- a first plurality of serially coupled code-generation blocks each for generating a CRC value based on data input to said block, respective blocks of said first plurality of code-generation blocks configured for receiving data inputs ranging from byte widths respectively of $F_x$, $F_{x-1}$, . . . $F_1$, where $F_x \geq F_{x-1} \geq \ldots \geq F_1 \geq 0$ bytes;
- a second plurality of parallel coupled code-generation blocks each for generating a CRC value based on data input to said block, respective blocks of said second plurality of code-generation blocks configured for receiving data inputs having respective byte widths $G_{y-i}$ where $G_{y-i}=G_{y-i-1}+1$ for i=0 to y−1, where $y \geq F_1-1$;
- a multiplexor means controllable for selecting particular CRC code generation blocks in said first and second pluralities to be included in a CRC calculation based on said data input;
- wherein by selectively including or bypassing CRC code generation blocks any number of data input bytes may be processed for corresponding CRC code generation according to a relation:
$A_x*F_x+A_{x-1}*F_{x-1}+ \ldots +A_1*F_1+B_y*G_y+ \ldots +B_1*G_1$,
where $A_x, A_{x-1}, \ldots A_1, B_y, \ldots B_1$=0 or 1.

12. The CRC code generating circuit as claimed in claim 11, wherein said $F_x=2^N$, $F_{x-1}=2^{N-1}$, . . . $F_1=2^0$; and $y=F_1-1=0$.

13. The CRC code generating circuit as claimed in claim 11, wherein said $F_x=2^N$, $F_{x-1}=2^{N-1}$, . . . $F_1=2^{N-L}$, $G_y \geq 2^{N-L}-1$, . . . $G_1=1$; and L is a whole number based on a maximum propagation delay criteria for processing CRC values in said first plurality.

14. The CRC code generating circuit as claimed in claim 11, wherein said $F_x=2^N+M$, $F_{x-1}=2^{N-1}+M$, . . . $F_1=2^{N-L}+M$, $G_y \geq 2^{N-L}+M-1$, . . . $G_1=1$.

15. The CRC code generating circuit as claimed in claim 11, wherein said $F_x=F_{x-1}= \ldots =F_1=S$; and $G_y=y-1, \ldots G_1=1$ where $y \geq S-1$.

* * * * *